(12) United States Patent
Nelson

(10) Patent No.: US 6,794,691 B2
(45) Date of Patent: Sep. 21, 2004

(54) USE OF IRREGULARLY SHAPED CONDUCTIVE FILLER FEATURES TO IMPROVE PLANARIZATION OF THE CONDUCTIVE LAYER WHILE REDUCING PARASITIC CAPACITANCE INTRODUCED BY THE FILLER FEATURES

(75) Inventor: Mark Michael Nelson, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/348,093

(22) Filed: Jan. 21, 2003

(65) Prior Publication Data

US 2004/0140484 A1 Jul. 22, 2004

(51) Int. Cl.⁷ .............................................. H01L 29/73
(52) U.S. Cl. ...................... 257/208; 438/626; 438/631; 438/692; 438/697
(58) Field of Search ................................ 438/626, 692, 438/697, 631, 633; 257/208, 773

(56) References Cited

U.S. PATENT DOCUMENTS

| | | | |
|---|---|---|---|
| 5,278,105 A | 1/1994 | Eden et al. | 437/250 |
| 5,636,133 A | 6/1997 | Chesebro et al. | 364/491 |
| 5,798,298 A | 8/1998 | Yang et al. | 438/622 |
| 5,854,125 A | * 12/1998 | Harvey | 438/626 |
| 5,885,856 A | 3/1999 | Gilbert et al. | 438/129 |
| 5,970,238 A | * 10/1999 | Shibata et al. | 716/8 |
| 6,156,660 A | 12/2000 | Liu et al. | 438/692 |
| 6,284,647 B1 | 9/2001 | Chien et al. | 438/633 |

OTHER PUBLICATIONS

"Rapid Characterization and Modeling of Pattern–Dependent Variation in Chemical–Mechanical Polishing"; Brian E. Stine, Dennis O. Ouma, Member, IEEE, Rajesh R. Divecha, Member, IEEE, Duane S. Boning, IEEE, James E. Chung, Member, IEEE, Dale L. Harington, Member, IEEE, C. Randy Harwood, O. Samuel Nakagawa, and Soo–Young Oh, Member, IEEE; 1998 IEEE, pp. 129 to 140.

"The Physical and Electrical Effects of Metal–Fill Patterning Practices for Oxide Chemical–Mechanical Polishing Processes"; Brian E. Stine, Duane S. Boning, member, IEEE, James E. Chung, Lawrence Camilletti, Frank Kruppa, Edward R. Equi, William Loh, Sharad Prasad, Moorthy Muthukrishnan, Daniel Towery, Micahel Berman, and Ashook Kapoor. 1998 EEE, pp. 665 to 679.

* cited by examiner

Primary Examiner—Nathan J Flynn
Assistant Examiner—Pershelle Greene
(74) Attorney, Agent, or Firm—Workman Nydegger

(57) ABSTRACT

A fabricated multiple layer integrated circuit in which adequate planarization is accomplished using irregularly shaped and properly spaced conductive filler features that are spaced in such a way that capacitive coupling of the conductive filler features with the active conductive regions is reduced. The overall layout area of the conductive filler features is reduced to thereby reduced capacitive coupling with active conductive above and below. In addition, a relatively small edge of the feature is closest to the active conductive in the same conductive layer thereby further reducing capacitive coupling.

53 Claims, 3 Drawing Sheets

USE OF IRREGULARLY SHAPED CONDUCTIVE FILLER FEATURES TO IMPROVE PLANARIZATION OF THE CONDUCTIVE LAYER WHILE REDUCING PARASITIC CAPACITANCE INTRODUCED BY THE FILLER FEATURES

BACKGROUND OF THE INVENTION

1. The Field of the Invention

The present invention relates to semiconductor device fabrication technology, and more specifically, to structures and methods for placing irregularly shaped metal filler features in a layer of a multiple layer circuit to improve planarization of the layer while reducing parasitic capacitance introduced by the filler metal.

2. Background and Related Art

Computing technology has revolutionized the way people work and play and has contributed enormously to the advancement of humankind. Much of computing technology has been enabled by the discovery and advancement of semiconductor processing technology.

Semiconductor processing technology allows for the formation of highly integrated circuits with multiple metal layers. The minimum feature size within these fabricated circuits has been declining and now is well below one micron (commonly 0.18 or 0.13 microns). For a sense of scale, one micron is just one thousandth of a millimeter. Accordingly, extremely complex and powerful circuits can be fabricated all within a relatively small space. This allows electronic circuits to be relatively unobtrusive while yet providing significant technological achievement in even small devices such as mobile telephones.

As previously mentioned, such integrated circuits are often fabricated with multiple metal layers. Each metal layer includes a patterned metal material (such as Aluminum). An appropriate insulating layer (such as Silicon Dioxide) is formed over the patterned metal material. Each metal layer is most reliably fabricated when the surface upon which the metal layer is formed is relatively flat. Accordingly, once the fabrication of a metal layer has been completed by the formation of the insulating material over the metal, and if there are to be further metal layers formed thereon, the insulating material is planarized so that the yet-to-be-fabricated upper metal layers may have a smooth foundation upon which to be fabricated. Typically, such planarization is accomplished using a high-precision Chemical-Mechanical Polish (CMP) machine that uses a combination of mechanical force and chemical reaction to planarized the surface.

One conventional and known problem associated with planarization is illustrated in FIGS. 3A and 3B. FIG. 3A illustrates a vertical cross-section 300A that includes a metal layer covered with insulating material prior to planarization. A metal material 301 is formed on a relatively flat substrate 302. For example, the metal material 301 may be a metal wire in which case the metal wire may extend into and out of FIG. 3A. The substrate 302 may be composed of a crystalline semiconductor or other material, or may be the planarized insulator of a lower metal layer. An intermetallic insulation material 303 is deposited over the metal 301 to avoid shorting the metal material 301 with any metal in the yet-to-be-fabricated upper metal layers. Note that the insulation material crests upward at about the position of the metal material as labeled by arrow 304. On the other hand, the insulation material ebbs fairly low at other positions far away from the metal material as labeled by arrow 305.

FIG. 3B illustrates a cross section 300B of the fabricated metal material with surrounding insulation material after planarization. Note that some portions of the insulation material have been properly planarized (e.g., the portion above and close by the metal material). However, due to the ebbing of the insulation material, some portions of the insulation material have remained relatively unaffected by the planarization. This results in the occurrence of topological recessions called "dishes" within what was hoped to be a relatively flat top surface of the metal layer. For example, surface 306 over the metal material 301 is relatively flat, while surface 305 remains recessed and largely unaffected by planarization.

In order to guard against this dishing and enable better planarization, it is common to place dummy metal filler features in spaces between active metal. For example, in the cross section 300A of FIG. 3A, a designer may opt to place filler metal features on the substrate 302 at about the position of the arrow 305 to thereby reduce ebbing that would appear alter the insulation is formed. Accordingly, dishing would be eliminated or at least less pronounced.

Although the active and filler metal are physically isolated, there is some capacitive interaction. For example, the filler metal has some capacitive coupling to the active metal in both the same metal layer as well as the active metal in other metal layers. This capacitive coupling has the effect of slowing down the operation of the circuit as a whole. Despite such performance degradation, metal is typically used as the filler material. due to processing efficiencies since the filler metal can be formed with the same processing steps as are used to form the active metal assuming an appropriately patterned mask.

FIG. 4 illustrates a conventional layout as viewed downwards perpendicular to the plane defined by the substrate (hereinafter referred to as a "topview"). The active metal regions (i.e., the metal that forms part of the operating integrated circuit) are defined by those regions such as region 401 that are filled with diagonal hatch lines. The filler metal regions are defined by those regions such as region 402 that are filled with dots. Each discrete rectangular filler region corresponds to a metal filler feature.

The capacitive coupling of the filler metal with upper and lower active metal material is a strong function of the layout area occupied by the metal filler regions. Also, the capacitive coupling of the metal filler features with the active metal within the same metal layer is a function of the size of the end of the metal filler feature that is closest to the active metal. As seen from FIG. 4, there is a large amount of layout area consumed by the rectangular metal filler features. Also, the size of the most proximate edge of the metal filler feature that is closest to the active metal may be quite large depending on the orientation of the active metal since the filler features are rectangular. Accordingly, there is some capacitive coupling caused by the introduction of the filler metal.

What would be advantageous would be mechanisms for using metal filler features in a manner that reduces such capacitive coupling.

BRIEF SUMMARY OF THE INVENTION

The foregoing problems with the prior state of the art are overcome by the principles of the present invention, which are directed towards an integrated circuit (and a corresponding method of fabricating the same) in which there is a number of conductive layers (e.g., metal or highly-doped polycrystalline semiconductor). At least one of the conductive layers has irregularly shaped and properly spaced conductive filler features. In particular, the conductive layer includes a number of active conductive components that are used for the electrical operation of the integrated circuit. Also, conductive filler features are interposed amongst the active conductive components.

Each of the conductive filler features may be conceptually bounded by a bounding box that has upper, right, lower, and left edges that aligns with the upper-most, right-most, lower-most, and left-most edges, respectively, of the corresponding conductive filler feature. At least some and potentially all of the conductive features are spaced from each other so that the bounding box of each of the conductive filler features does not overlap with any other bounding box of any of the other conductive filler features. In addition, the conductive filler features occupy only a fraction (perhaps from approximately fifteen to seventy percent, or perhaps from approximately twenty-five to fifty-five percent) of its bounding box. By spacing in this manner, the capacitive coupling with the active conductive components in the upper and/or lower conductive layers may be reduced.

The conductive features may be, for example, the shape of a plus sign or perhaps the shape of a squared "Y" or like a "T". In addition, a relatively small edge of the feature may be the edge that is most proximate to the closest active region. By orienting the features in this manner, particularly for the features that neighbor the active region, the capacitive coupling between the features and the active regions in the same conductive layer may also be significantly reduced.

The reduction in capacitive coupling allows for faster circuit designs. In addition, since the conductive filler features have irregular shapes that are spaced properly, the layout area that is occupied by the conductive filler material is reduced, while still allowing for proper filling of the layer to enable adequate planarization.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention involve a fabricated multiple conductive layer integrated circuit in which adequate planarization is accomplished using irregularly shaped and properly spaced conductive filler features that are spaced in such a way that capacitive coupling of the conductive filler features with the active conductive regions is reduced. The overall layout area of the conductive filler features is reduced to thereby reduce capacitive coupling with active conductive components above and/or below the conductive filler features. In addition, a relatively small edge of the feature is closest to the active conductive component in the same conductive layer thereby further reducing capacitive coupling.

Figure 1:
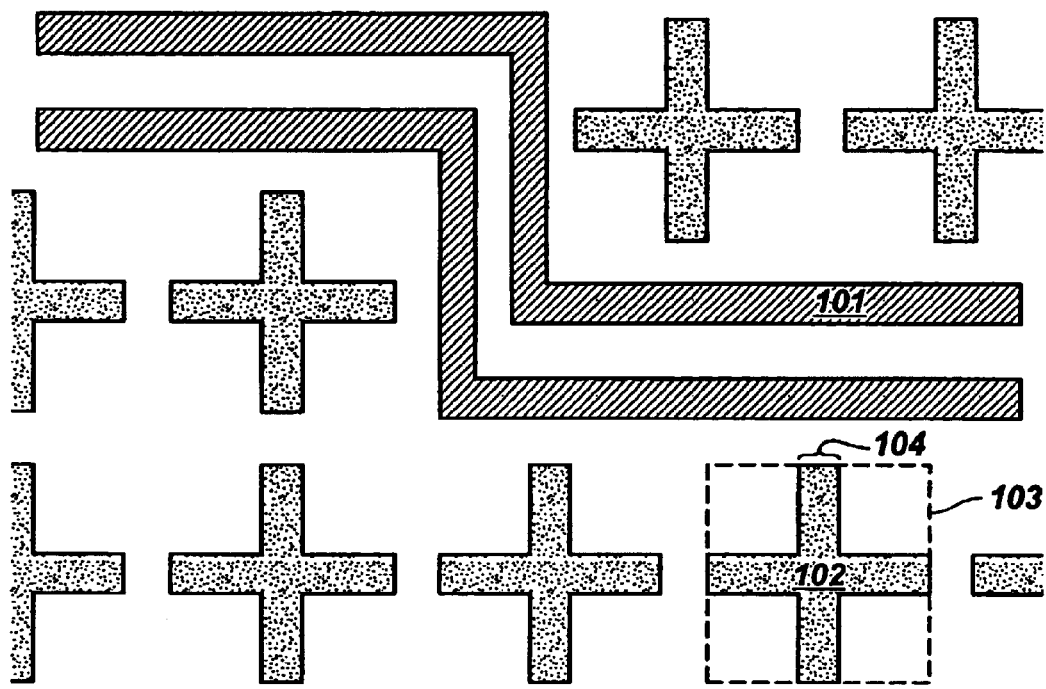
FIG. 1 illustrates a top view of a conductive layer in accordance with one embodiment of the invention in which the conductive filler layers are composed of plus-sign shaped structures.

An integrated circuit conventionally has a number of conductive layers formed on a substrate. FIG. 1 illustrates a top view of one of the conductive layers in accordance with a first embodiment of the present invention in which conductive filler layers are composed of plus-sign shaped structures. The active conductive components that are used for the electrical operation of the circuit are illustrates as being cross-batched. For example, element 101 is an active conductive component. The conductive material may be any conductive metal such as aluminum, copper, gold or any other metal or alloys thereof. Furthermore, the conductive material may be composed of highly conductive non-metals such as highly-doped polymorphous semiconductor.

The conductive layer also includes a number of conductive filler features that are interposed amongst the active conductive components. For example, the dot-filled elements of FIG. 1 (e.g., element 102) are conductive filler features. For processing efficiency, conductive filler features are typically made of the same material as the active conductive components since such processing allows for the fabrication of both the active and filler metal features using the same metalization mask.

Each of the conductive filler features has a conceptual bounding box that has an upper, right, lower, and left edge that aligns with the upper-most, right-most, lower-most, and left-most edge of the corresponding conductive filler feature. For example, the corresponding bounding box for element 102 is labeled as bounding box 103. The bounding box of at least one of the conductive filler features is non-overlapping with any other bounding box of any of the other conductive filler features. In the illustrated embodiment of FIG. 1, all of the illustrated conductive filler features have non-overlapping bounding boxes. However, the principles of the present invention may also be advantageous even if not all (e.g., ten percent or more, twenty-five percent or more, fifty percent of more, seventy-five percent or more, or ninety percent or more) of the bounding boxes are non-overlapping with any other bounding box.

Furthermore, at least some of the conductive filler features occupy only a portion of their corresponding bounding box. For example, in one embodiment, each of the conductive filler features occupies from fifteen to seventy percent, and in one embodiment from twenty-five to fifty percent of the entire area of its corresponding bounding box.

Accordingly, since at least some of the conductive filler features have non-overlapping bounding boxes and occupy only a portion of the bounding box, the conductive filler features are distributed in a manner that the cross-sectional area of the conductive filler features as viewed from the top is reduced, thereby reducing capacitive coupling to active conductive components above and below the conductive filler feature. For example, the conductive filler features shaped and distributed as illustrated in FIG. 1 significantly reduce capacitive coupling while still improving planarization.

In order to further reduce capacitive coupling with active conductive components in the same conductive layer, a conductive filler feature that neighbors an active conductive component has a relatively small edge that is proximate the active conductive component For example, conductive filler feature 102 has a relatively small edge 104 that is proximate the cross-hatched active conductive component In order to reduce the capacitive coupling, the relatively small edge should have a length that is less than sixty percent of the length of the corresponding bounding box.

Figure 2:
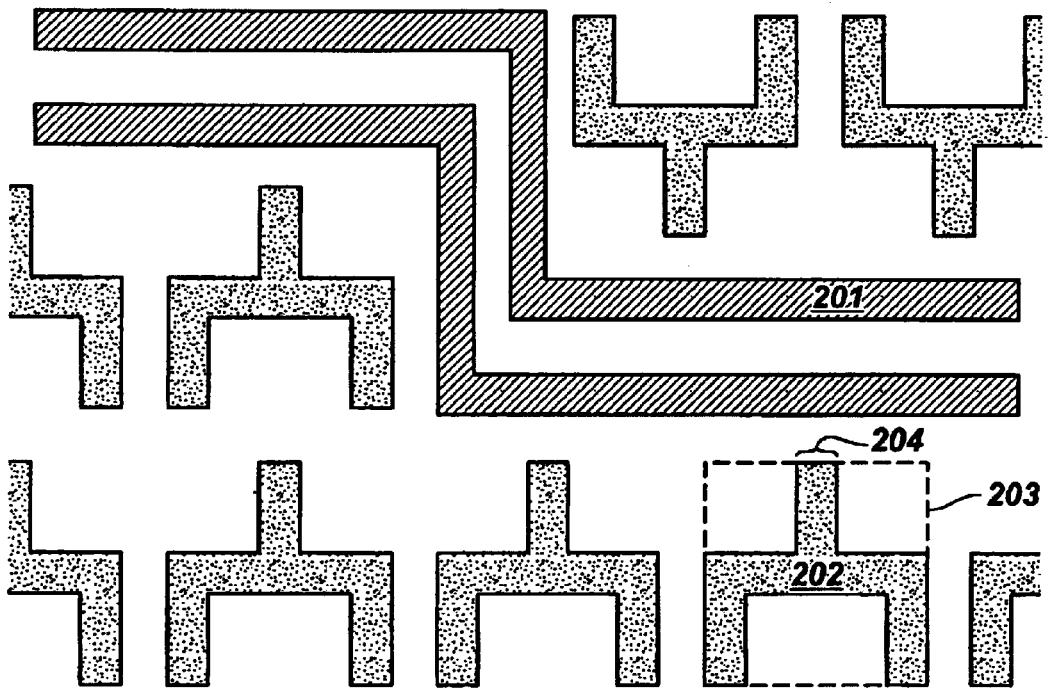
FIG. 2 illustrates a top view of a conductive layer in accordance with another embodiment of the invention in which the conductive filler layers are composed of squared-Y or goalpost shaped structures.
Figure 3A:
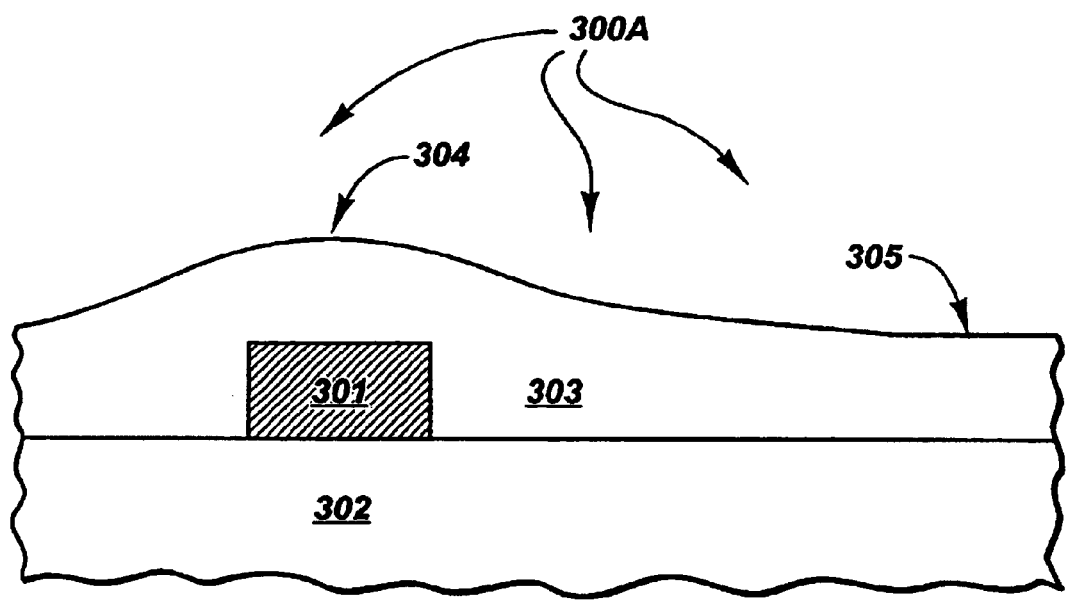
FIG. 3A illustrates a vertical cross-section of a conventional metal layer prior to planarization.
Figure 3B:
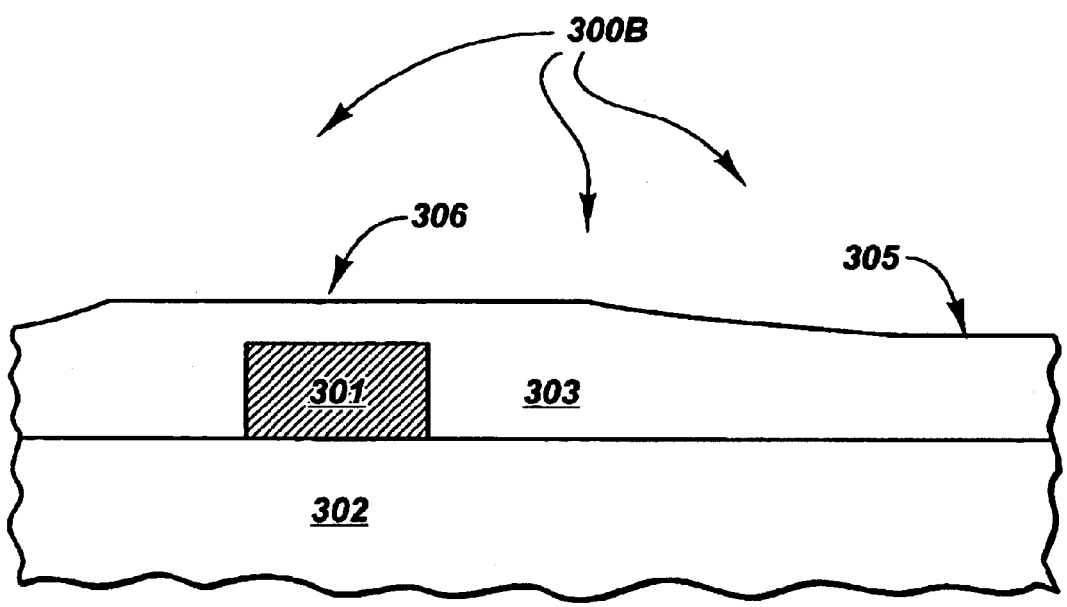
FIG. 3B illustrates a vertical cross-section of the metal layer after planarization.
Figure 4:
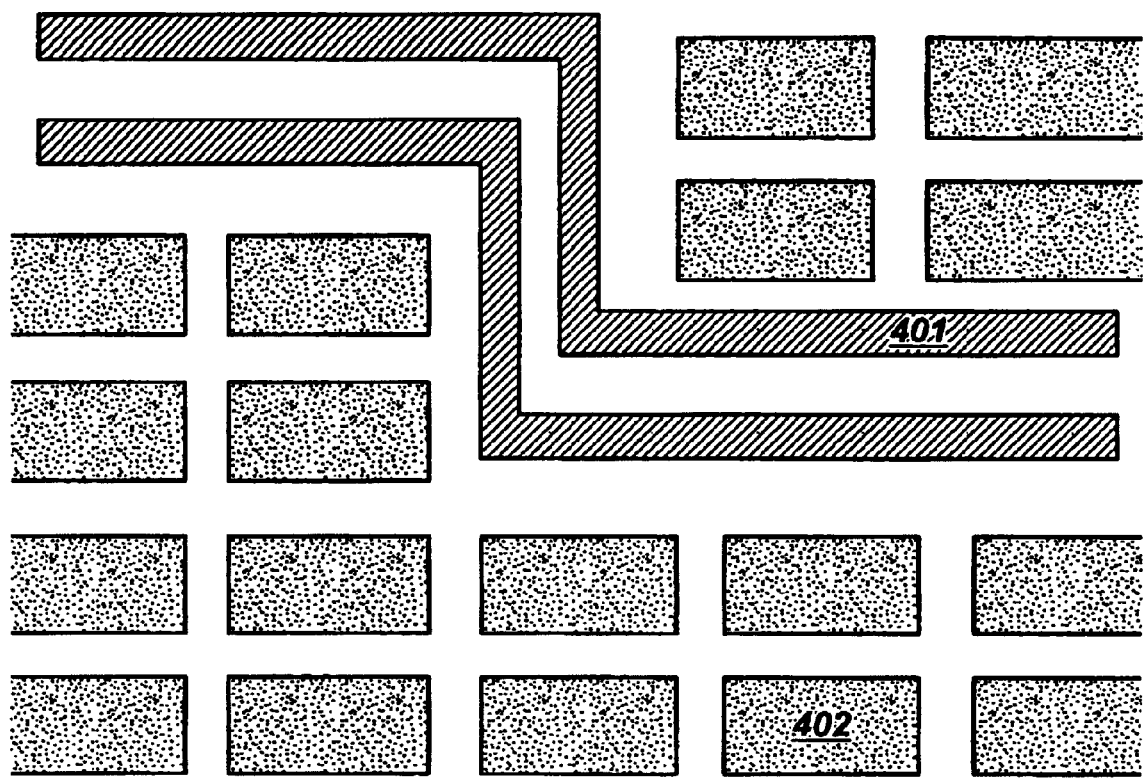
FIG. 4 illustrates a top view of a conventional metal layer in which rectangular-shaped metal filler structures are used to improve planarization.

While FIG. 1 shows one potential layout in accordance with the principles of the present invention. There are many different layouts which provide advantages in accordance with the principles of the present invention. For example, FIG. 2 illustrates an embodiment in which the conductive filler features are shaped like a squared-Y or like American football goalposts. The conductive filler feature 202, for example, includes a bounding box 203 as well as a relative small edge 204 proximate the nearest active conductive component. The conductive filler features may also be shaped like a "T", or mixes of the plus, squared-Y or "T" shapes or any other shape that reduces capacitive coupling. The active components 201 of FIG. 2 are shaped similarly to the active components 101 of FIG. 1 although the configuration of active components is not important to the principles of the present invention.

Accordingly, the principles of the present invention allow for reduced capacitive coupling and thus faster circuits, while enabling sufficient planarization. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An integrated circuit having a plurality of conductive layers, a particular conductive layer of the plurality of conductive layers comprising the following:
   a plurality of active conductor components that are used for the electrical conduction operation of the integrated circuit; and
   a plurality of conductor filler features that are interposed amongst the plurality of active conductor components, wherein a bounding box for each of the plurality of conductor filler features has an upper, right, lower, and left edge that aligns with the upper-most, right-most, lower-most, and left-most edge of the corresponding conductive filler feature,
   the bounding box of each of a group of at least one of the plurality of conductive filler features non-overlapping with any other bounding box of any of the plurality of conductive filler features,
   each of the group of at least one of the plurality of conductive filler features occupying from approximately fifteen to seventy percent of its bounding box,
   wherein a neighboring conductive filler feature of the group of at least one of the plurality of conductive filler features neighbors an active conductive component of the plurality of active conductive components, the neighboring conductive filler feature having a relatively small edge on each of the upper, right, lower, and left edge border of the bounding box that in each dimension is less than sixty percent of the length of the neighboring conductive filler feature's bounding box along the corresponding edge of the bounding box.

2. An integrated circuit in accordance with claim 1, wherein the group of at least one of the plurality of conductive filler features comprises at least ten percent of the plurality of conductive filler features.

3. An integrated circuit in accordance with claim 1, wherein the group of at least one of the plurality of conductive filler features comprises at least twenty-five percent of the plurality of conductive filler features.

4. An integrated circuit in accordance with claim 1, wherein the group of at least one of the plurality of conductive filler features comprises at least fifty percent of the plurality of conductive filler features.

5. An integrated circuit in accordance with claim 1, wherein the group of at least one of the plurality of conductive filler features comprises at least seventy-five percent of the plurality of conductive filler features.

6. An integrated circuit in accordance with claim 1, wherein the group of at least one of the plurality of conductive filler features comprises at least ninety percent of the plurality of conductive filler features.

7. An integrated circuit in accordance with claim 1, wherein the group of at least one of the plurality of conductive filler features are all of the plurality of conductive filler features.

8. An integrated circuit in accordance with claim 1, wherein each of the group of at least one of the plurality of conductive filler features occupies from approximately twenty-five to fifty-five percent of its bounding box.

9. An integrated circuit in accordance with claim 8, wherein the group of at least one of the plurality of conductive filler features comprises at least ten percent of the plurality of conductive filler features.

10. An integrated circuit in accordance with claim 8, wherein the group of at least one of the plurality of conductive filler features comprises at least twenty-five percent of the plurality of conductive filler features.

11. An integrated circuit in accordance with claim 8, wherein the group of at least one of the plurality of conductive filler features comprises at least fifty percent of the plurality of conductive filler features.

12. An integrated circuit in accordance with claim 8, wherein the group of at least one of the plurality of conductive filler features comprises at least seventy-five percent of the plurality of conductive filler features.

13. An integrated circuit in accordance with claim 8, wherein the group of at least one of the plurality of conductive filler features comprises at least ninety percent of the plurality of conductive filler features.

14. An integrated circuit in accordance with claim 8, wherein the group of at least one of the plurality of conductive filler features are all of the plurality of conductive filler features.

15. An integrated circuit in accordance with claim 1, wherein each of the group of at least one of the plurality of conductive filler features is shaped like a plus sign.

16. An integrated circuit in accordance with claim 1, wherein each of the group of at least one of the plurality of conductive filler features is shaped like a squared Y.

17. An integrated circuit in accordance with claim 1, wherein the
   plurality of active conductive components and the plurality of conductive filler components are composed of a metal.

18. An integrated circuit in accordance with claim 17, wherein the plurality of active conductive components and the plurality of conductive filler components are composed of aluminum or an aluminum alloy.

19. An integrated circuit in accordance with claim 1, wherein the plurality of active conductive components and the plurality of conductive filler components are composed of a conductive non-metal.

20. An integrated circuit in accordance with claim 19, wherein the plurality of active conductive components and the plurality of conductive filler components are composed of highly-doped polymorphous semiconductor material.

21. A method for fabricating a conductive layer in an integrated circuit that has a plurality of conductive layers, the method comprising the following:
an act of fabricating a plurality of active conductive components that are used for the electrical operation of the integrated circuit; and
an act of fabricating a plurality of conductive filler features that are interposed amongst the plurality of active conductive components, wherein a bounding box for each of the plurality of conductive filler features has an upper, right, lower, and left edge that aligns with the upper-most, right-most, lower-most, and left-most edge of the corresponding conductive filler feature,
the bounding box of each of a group of at least one of the plurality of conductive filler features non-overlapping with any other bounding box of any of the plurality of conductive filler features,
each of the at least one of the plurality of conductive filler features occupying from approximately fifteen to seventy percent of its bounding box,
wherein a neighboring conductive filler feature of the group of at least one of the plurality of conductive filler features neighbors an active conductive component of the plurality of active conductive components, the neighboring conductive filler feature having a relatively small edge on each of the upper, right, lower, and left edge border of the bounding box that in each dimension is less than sixty percent of the length of the neighboring conductive filler feature's bounding box alone the corresponding edge of the bounding box.

22. A method in accordance with claim 21, wherein the group of at least one of the plurality of conductive filler features comprises at least ten percent of the plurality of conductive filler features.

23. A method in accordance with claim 21, wherein the group of at least one of the plurality of conductive filler features comprises at least twenty-five percent of the plurality of conductive filler features.

24. A method in accordance with claim 21, wherein the group of at least one of the plurality of conductive filler features comprises at least fifty percent of the plurality of conductive filler features.

25. A method in accordance with claim 21, wherein the group of at least one of the plurality of conductive filler features comprises at least seventy-five percent of the plurality of conductive filler features.

26. A method in accordance with claim 21, wherein the group of at least one of the plurality of conductive filler features comprises at least ninety percent of the plurality of conductive filler features.

27. A method in accordance with claim 21, wherein the group of at least one of the plurality of conductive filler features are all of the plurality of conductive filler features.

28. A method in accordance with claim 21, wherein each of the group of at least one of the plurality of conductive filler features occupies from approximately twenty-five to fifty-five percent of its bounding box.

29. A method in accordance with claim 28, wherein the group of at least one of the plurality of conductive filler features comprises at least ten percent of the plurality of conductive filler features.

30. A method in accordance with claim 28, wherein the group of at least one of the plurality of conductive filler features comprises at least twenty-five percent of the plurality of conductive filler features.

31. A method in accordance with claim 28, wherein the group of at least one of the plurality of conductive filler features comprises at least fifty percent of the plurality of conductive filler features.

32. A method in accordance with claim 28, wherein the group of at least one of the plurality of conductive filler features comprises at least seventy-five percent of the plurality of conductive filler features.

33. A method in accordance with claim 28, wherein the group of at least one of the plurality of conductive filler features comprises at least ninety percent of the plurality of conductive filler features.

34. A method in accordance with claim 28, wherein the group of at least one of the plurality of conductive filler features are all of the plurality of conductive filler features.

35. A method in accordance with claim 21, wherein each of the group of at least one of the plurality of conductive filler features is shaped like a plus sign.

36. A method in accordance with claim 21, wherein each of the group of at least one of the plurality of conductive filler features is shaped like a squared Y.

37. A method in accordance with claim 21, wherein the plurality of active conductive components and the plurality of conductive filler components are composed of a metal.

38. A method in accordance with claim 37, wherein the plurality of active conductive components and the plurality of conductive filler components are composed of aluminum or an aluminum alloy.

39. A method in accordance with claim 21, wherein the plurality of active conductive components and the plurality of conductive filler components are composed of a conductive non-metal.

40. A method in accordance with claim 39, wherein the plurality of active conductive components and the plurality of conductive filler components are composed of highly doped polymorphous semiconductor material.

41. An integrated circuit having a plurality of conductive layers, a particular conductive layer of the plurality of conductive layers comprising the following:
a plurality of active conductor components that are used for the electrical conduction operation of the integrated circuit; and
a plurality of conductor filler features that are interposed amongst the plurality of active conductor components, wherein a bounding box for each of the plurality of conductor filler features has an upper, right, lower, and left edge that aligns with the upper-most, right-most, lower-most, and left-most edge of the corresponding conductive filler feature,
the bounding box of each of a group of at least one of the plurality of conductive filler features non-overlapping with any other bounding box of any of the plurality of conductive filler features,
each of the group of at least one of the plurality of conductive filler features occupying from approximately fifteen to seventy percent of its bounding box, wherein each of the group of at least one of the plurality of conductive filler features is shaped like a squared Y.

42. An integrated circuit in accordance with claim 41, wherein the group of at least one of the plurality of conductive filler features comprises at least ten percent of the plurality of conductive filler features.

43. An integrated circuit in accordance with claim 41, wherein each of the group of at least one of the plurality of conductive filler features occupies from approximately twenty-five to fifty-five percent of its bounding box.

44. An integrated circuit in accordance with claim 41, wherein the plurality of active conductive components and the plurality of conductive filler components are composed of a metal.

45. An integrated circuit in accordance with claim 41, wherein the plurality of active conductive components and the plurality of conductive filler components are composed of a conductive non-metal.

46. An integrated circuit having a plurality of conductive layers, a particular conductive layer of the plurality of conductive layers comprising the following:

a plurality of active conductor components that are used for the electrical conduction operation of the integrated circuit; and a plurality of conductor filler features that are interposed amongst the plurality of active conductor components, wherein a bounding box for each of the plurality of conductor filler features has an upper, right, lower, and left edge that aligns with the upper-most, right-most, lower-most, and left-most edge of the corresponding conductive filler feature, the bounding box of each of a group of at least one of the plurality of conductive filler features non-overlapping with any other bounding box of any of the plurality of conductive filler features, each of the group of at least one of the plurality of conductive filler features occupying from approximately fifteen to seventy percent of its bounding box, wherein the plurality of active conductive components and the plurality of conductive filler components are composed of a conductive non-metal.

47. An integrated circuit in accordance with claim 46, wherein the group of at least one of the plurality of conductive filler features comprises at least ten percent of the plurality of conductive filler features.

48. An integrated circuit in accordance with claim 46, wherein each of the group of at least one of the plurality of conductive filler features occupies from approximately twenty-five to fifty-five percent of its bounding box.

49. An integrated circuit in accordance with claim 46, wherein each of the group of at least one of the plurality of conductive filler features is shaped like a plus sign.

50. An integrated circuit in accordance with claim 46, wherein each of the group of at least one of the plurality of conductive filler features is shaped like a squared Y.

51. An integrated circuit in accordance with claim 46, wherein the plurality of active conductive components and the plurality of conductive filler components are composed of highly-doped polymorphous semiconductor material.

52. An integrated circuit in accordance with claim 46, wherein a neighboring conductive filler feature of the group of at least one of the plurality of conductive filler features neighbors an active conductive component of the plurality of active conductive components, the neighboring conductive filler feature having a relatively small edge that is proximate the active conductive component.

53. An integrated circuit in accordance with claim 52, wherein the relatively small edge has a length that is less than sixty percent of the length of the neighboring conductive filler feature's bounding box in the direction of the length.

* * * * *

UNITED STATES PATENT AND TRADEMARK OFFICE
CERTIFICATE OF CORRECTION

PATENT NO. : 6,794,691 B2
DATED : September 21, 2004
INVENTOR(S) : Mark Micheal Nelson It is certified that error appears in the above-identified patent and that said Letters Patent is hereby corrected as shown below:

Title page,
Item [56], References Cited, OTHER PUBLICATIONS, "Rapid Characterization and Modeling of Pattern-Dependent Variation in Chemical-Mechanical Polishing" reference, after "Duane S. Boning," insert -- Member --; and "The Physical and Electrical Effects of Metal-Fill Pattern Practices for Oxide Chemical-Mechanical Polishing Processes" reference, after "1998" change "EEE" to -- IEEE --
Item [57], ABSTRACT,
Line 7, before "capacitive" change "reduced" to -- reduce --

Column 1,
Line 49, change "planarized" to -- planarize --

Column 2,
Line 17, change "alter" to -- after --

Column 4,
Line 17, change "illustrates" to -- illustrated --
Line 18, change "cross-batched" to -- cross-hatched --

Column 5,
Lines 1 and 3, after "component" insert -- . --

Column 6,
Line 60, do not begin a new paragraph after "the"

Column 7,
Line 37, change "alone" to -- along --

Signed and Sealed this

Nineteenth Day of April, 2005

JON W. DUDAS
*Director of the United States Patent and Trademark Office*